United States Patent [19]
Geiss et al.

[11] Patent Number: 5,635,419
[45] Date of Patent: Jun. 3, 1997

[54] POROUS SILICON TRENCH AND CAPACITOR STRUCTURES

[75] Inventors: Peter J. Geiss, Underhill; Donald M. Kenney, Shelburne, both of Vt.

[73] Assignee: International Business Machines Corporation, Armonk, N.Y.

[21] Appl. No.: 435,028

[22] Filed: May 4, 1995

Related U.S. Application Data

[62] Division of Ser. No. 330,652, Oct. 28, 1994, Pat. No. 5,508,542.
[51] Int. Cl.[6] .................................................. H01L 21/8242
[52] U.S. Cl. ........................... 438/386; 438/960; 438/421
[58] Field of Search ........................... 437/60, 71, 919, 437/977, 978; 148/DIG. 14, DIG. 138

[56] References Cited

U.S. PATENT DOCUMENTS

| | | | |
|---|---|---|---|
| 4,967,248 | 10/1990 | Shimizu | 257/304 |
| 5,068,199 | 11/1991 | Sandhu | 437/60 |
| 5,254,503 | 10/1993 | Kenney | 437/977 |
| 5,372,962 | 12/1994 | Hirota et al. | 437/60 |

*Primary Examiner*—Chandra Chaudhari
*Attorney, Agent, or Firm*—Heslin & Rothenberg, P.C.

[57] ABSTRACT

The invention provides a capacitor structure utilizing porous silicon as a first plate of the capacitor structure, thereby greatly increasing the surface area available for the capacitor and thereby the capacitance attainable. The invention also provides a trench structure having a porous silicon region surrounding the sidewalls thereof. Such a trench can then be utilized to form a capacitor according to the subject invention. Methods of producing the capacitor and trench structures according to the subject invention are also provided. Porous silicon is produced utilizing electrolytic anodic etching.

34 Claims, 14 Drawing Sheets

POROUS SILICON TRENCH AND CAPACITOR STRUCTURES

This application is a division of U.S. application Ser. No. 08/330,652, now U.S. Pat. No. 5,508,542 filed Oct. 28, 1994.

TECHNICAL FIELD

This invention relates to high surface area capacitors for use in the semiconductor industry, and more particularly to capacitors utilizing porous silicon as one plate of the capacitor to increase the surface area thereof.

BACKGROUND ART

The technology of producing semiconductor devices has been continually pressured to increase effective device densities in order to remain cost competitive. As a result, Very Large Scale Integration (VLSI) and Ultra Large Scale Integration (ULSI) technologies have entered the sub-micron realm of structural dimension and are approaching physical limits in the nanometer feature size range. In the foreseeable future, absolute atomic physical limits will be reached in the conventional two-dimensional approach to semiconductor device design.

A two-dimensional design capacitor includes a planar capacitor (see FIG. 1). In the planar capacitor 10, the lower plate of the capacitor is formed from the n+ silicon substrate extension 12 of storage node junction 14 of field-effect transistor (FET) 15. The upper capacitor plate (or field plate) 16 is formed from a layer of conductively-doped polycrystalline silicon. Node extension 12 is electrically insulated from upper plate 16 by a dielectric layer 18.

Planar capacitors have generally proven adequate for use in DRAM chips up to the one-megabit level. However, as device densities have increased, the desirable size of capacitors has grown smaller and smaller while the desirable capacitance has increased. The difficult goal of a DRAM designer is therefore to increase, or at least maintain, cell capacitance as cell size shrinks, without resorting to processes that reduce product yield or that markedly increase the number of masking and deposition steps in the production process.

Several methods for providing adequate cell capacitance in the face of shrinking cell size are in use. Many of these efforts are aimed at creating complex three-dimensional capacitors. Such three-dimensional capacitors include trench capacitors and stacked capacitors.

Trench capacitors 19 (see FIG. 2) are employed to provide greater plate area, and therefore greater capacitance. The lower plate 20 may be formed from the n+ doped silicon substrate or it may be formed from a polysilicon layer which lines a trench cut in the n+ doped silicon substrate. The upper plate 22 is formed from a layer of conductively-doped polycrystalline silicon. Lower plate 20 and upper plate 22 are electrically insulated with a dielectric layer 24.

Another three-dimensional technique is the stacking of capacitor plates between dielectric layers on the DRAM cell surface. FIG. 3 is a graphic representation of a typical DRAM cell having a stacked capacitor 26. The lower plate 28 is formed from an n-type polycrystalline silicon layer which is in contact with the silicon substrate 30 in the region of the FET storage node junction, while the upper plate 32 is formed from a conductively-doped polycrystalline silicon layer. The two layers are separated by a dielectric layer 34. Lower plate 28 and upper plate 32 are both stacked on top of FET 36 and word line 38, resulting in a high-profile cell which requires more stringent process control for the connection of bit line 40 to access-node junction 42.

Despite the availability of these three-dimensional capacitor structures, attempts have been made to even further increase the surface area of the capacitors, thereby increasing the capacitance. One such approach is disclosed in U.S. Pat. No. 5,068,199, issued Nov. 26, 1991, of Gurtej S. Sandhu entitled "Method for Anodizing a Polysilicon Layer Lower Capacitor Plate of a DRAM to Increase Capacitance" and U.S. Pat. No. 5,138,411, issued Aug. 11, 1992 of the same inventor entitled "Anodized Polysilicon Layer Lower Capacitor Plate of a DRAM to Increase Capacitance". This patent discloses the anodization of a deposited silicon layer to form porous silicon. The deposited and anodized layer of porous silicon forms the first plate of a capacitor, which due to its porous nature has a greater surface area for capacitance. One or more of the Sandhu patents disclose a single layer of silicon nitride as the suitable thin layer dielectric for use in DRAMs where capacitative layers are not smooth (i.e. porous silicon) as well as the use of polycrystalline silicon lined trench designs. This severely limits the applicability of the structure and method disclosed in Sandhu since multilayer dielectrics such as oxide/nitride, nitride/oxide, and oxide/nitride/oxide dielectrics offer significant advantages over single layer silicon nitride in many applications.

In Watanabe et al., A Novel Stacked Capacitor with Porous-Si Electrodes for High Density DRAMS, Symposium on VLSI Technology, pg. 17, May 17, 1993 the use of porous polycrystalline silicon as a substrate is taught. However, a need continues to exist for additional designs of capacitor structures with high surface area and high capacitance, without increasing the size of the capacitor structure.

DISCLOSURE OF INVENTION

It is thus an object of the invention to provide a capacitor structure with high surface area, obtained without increasing the size of the capacitor structure. It is a further object of the invention to provide a method of producing such a capacitor.

It is an object of the invention to provide a method of forming a trench capacitor in which the method is self-limiting and assures isolation of adjacent trenches. These trenches can then be utilized to form adjacent isolated trench capacitor structures.

In furtherance of these objectives, the subject invention utilizes the anodic etching of silicon, such as p+ monocrystalline silicon, to form pores or depression in the silicon. This greatly increases the surface area of the silicon, which is then coated with a dielectric material. The dielectric material extends to within the porous structure, coating substantially the entire surface of the pores within the porous silicon (referred to herein as conformally overlying the porous silicon). A layer of silicon is then deposited overlying the dielectric material, which again extends to within the porous structure, coating substantially the entire surface of the dielectric material within the pores within the porous silicon (referred to herein as conformally overlying the dielectric material). The resulting structure has a surface area for the capacitor (comprising the porous silicon as a first plate, the layer of silicon as the second plate, and the dielectric layer separating the first and second plates) much greater than can be achieved without making the silicon porous. The invention will be more readily understood in the context of the examples which follow.

In its more simple form, one embodiment of the present invention is directed to a semiconductor capacitor structure comprising a semiconductor substrate of silicon having an area of porous silicon extending into the substrate, a conformal layer of a dielectric material overlying the semiconductor substrate at the area of porous silicon, and a conformal layer of silicon overlying the layer of dielectric material. The area of porous silicon thus forms a first plate of a capacitor, and the conformal layer of silicon forms the second plate of the capacitor. The first plate and the second plate are separated by the dielectric material, which is preferably a multi-layer dielectric such as oxide/nitride, nitride/oxide, or oxide/nitride/oxide. Multi-layer dielectrics are preferred over single layer dielectrics because they are generally less conductive and therefore are better dielectrics for storing charge for a long period of time. Furthermore, multi-layer dielectrics are less likely than single layer silicon nitride dielectrics to trap charge because they are less conductive. It is undesirable for a dielectric in a storage capacitor to trap charge because then the amount of charge that can be stored in the capacitor will vary with time.

The semiconductor substrate can be monocrystalline silicon, and is preferably p+ monocrystalline silicon, and the conformal layer of silicon is preferably polysilicon. The area of porous silicon is preferably formed by electrolytic anodic etching.

In a further embodiment of the subject invention, there is provided a semiconductor trench structure which can be utilized in capacitor formation. The trench is formed in a semiconductor substrate, which may have an upper portion of p– or n-doped silicon and a lower portion of p+ silicon, in which case the trench is formed through the upper portion and into the lower portion. A porous silicon region surrounds the side walls and bottom of the trench. The location of the porous silicon region is determined by the selectivity of the anodic etch used to form the porous silicon. In one example, anodic etching is selective for the p+ silicon lower portion and therefore the porous silicon region does not extend appreciably into the p– or n-doped upper portion of silicon. As in the previous embodiment of the invention, the silicon substrate is preferably monocrystalline silicon.

The trench structure is utilized to form a capacitor structure by including a conformal layer of a dielectric material overlying the porous silicon region, and a conformal layer of silicon overlying the layer of dielectric. The porous silicon region thus forms the first plate of a capacitor structure, with the layer of silicon forming the second plate of the capacitor structure. The first plate and second plate are separated by the dielectric layer. Suitable dielectric layers in this embodiment can also include oxide or nitride in addition to multi-layer dielectrics such as oxide/nitride, nitride/oxide, and oxide/nitride/oxide, although multi-layer dielectrics are preferred, and the conformal silicon layer again preferably comprises polysilicon.

In a further embodiment of the subject invention, the anodic etching of the silicon to form porous silicon is utilized to form isolated, adjacent trenches. Specifically, a trench structure is provided which comprises a semiconductor substrate of silicon, which may have an upper portion of p– or n-doped silicon and a lower portion of p+ silicon. A first trench is formed in the semiconductor substrate, such as through the upper portion and into the lower portion, and the silicon in the lower portion surrounding the trench is made porous through anodic etching. Similarly, and in one embodiment simultaneously, a second trench is formed in the semiconductor substrate, such as through the upper portion and into the lower portion. The second trench is adjacent to the first trench, and must be isolated therefrom for proper functioning of the semiconductor device. This isolation is achieved through the electrolytic anodic etching of the porous silicon regions surrounding each of the two adjacent trenches. The anodic etching is self-limiting and leaves a wisp or continuous area of non-porous silicon in the semiconductor substrate between the two porous silicon regions. The anodic etching and creation of the wisp or continuous area of non-porous silicon is described in Tsao et al. J. Appl. Phys. Vol. 62, No. 10, 15 Nov 1987, which is hereby incorporated by reference. Where the substrate has an upper portion and a lower portion, the wisp is formed in the p+ silicon of the lower portion of the substrate. Thus, maximum usage of the silicon substrate as surface area for a capacitor structure is achieved, without jeopardizing the isolation of the two adjacent trenches from one another.

As in the previous example, this trench structure can be utilized to form a capacitor structure by the deposition of a conformal layer of a dielectric material overlying the porous silicon regions, and then conformally depositing a layer of silicon overlying the dielectric material. Two capacitor structures are thus formed. The first comprises the porous silicon area surrounding the first trench, the dielectric deposited thereover, and the layer of silicon deposited thereover. The second capacitor comprises the porous silicon area surrounding the second trench, the dielectric deposited thereover, and the layer of silicon deposited thereover.

Suitable semiconductor substrates, dielectric materials, and layers of silicon are as described in the previous examples of trench/capacitor structures.

The principles of the subject invention can be applied to various trench technologies, including semiconductor trench capacitor cells with merged isolation and node trench construction (see U.S. Pat. No. 4,801,988). In this embodiment, the surface area of the trench capacitor is increased by utilizing porous silicon as the first plate of the capacitor structure, in which the isolation layer and node trench are merged such that the isolation regions are self-aligned to the trench side walls. A trench capacitor of this type, even without the porous silicon usage, provides for greater surface area within a given space due to the merger. By utilizing porous silicon, this increase in surface area for the capacitor is even greater.

Methods of producing each of the trench and capacitor structures disclosed above are also provided herein. These methods will be more fully described in the sections which follow.

BRIEF DESCRIPTION OF DRAWINGS

The foregoing and other objects, features and advantages of the invention will be apparent from the following more particular description of preferred embodiments of the invention as illustrated in the accompanying drawings in which.

BEST MODE FOR CARRYING OUT THE INVENTION

Figure 1:
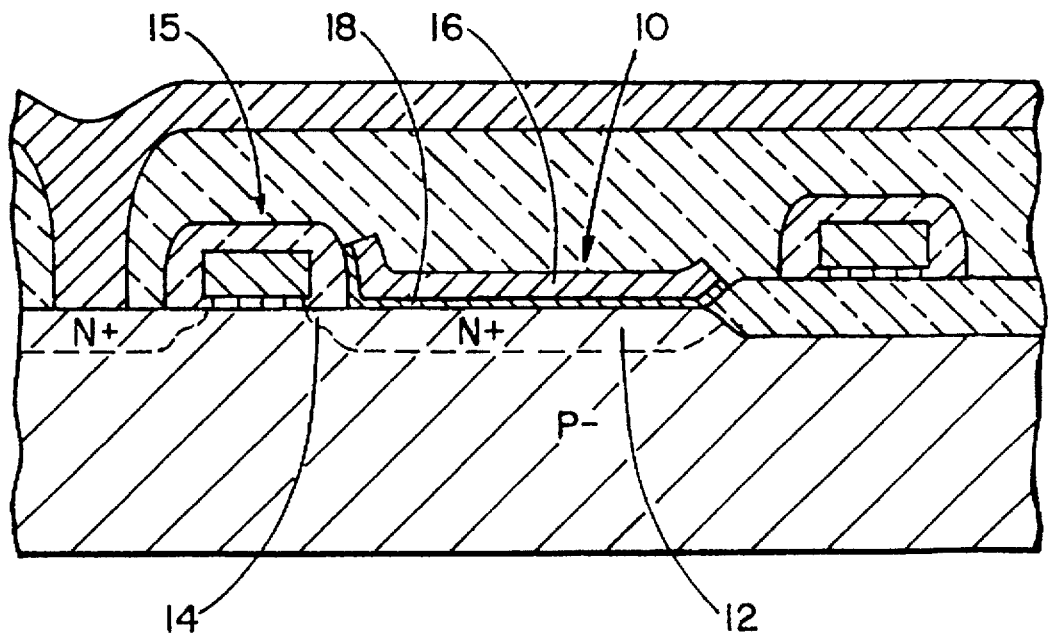
FIG. 1 is a cross-sectional view of a DRAM cell having a conventional planar capacitor according to the prior art.
Figure 2:
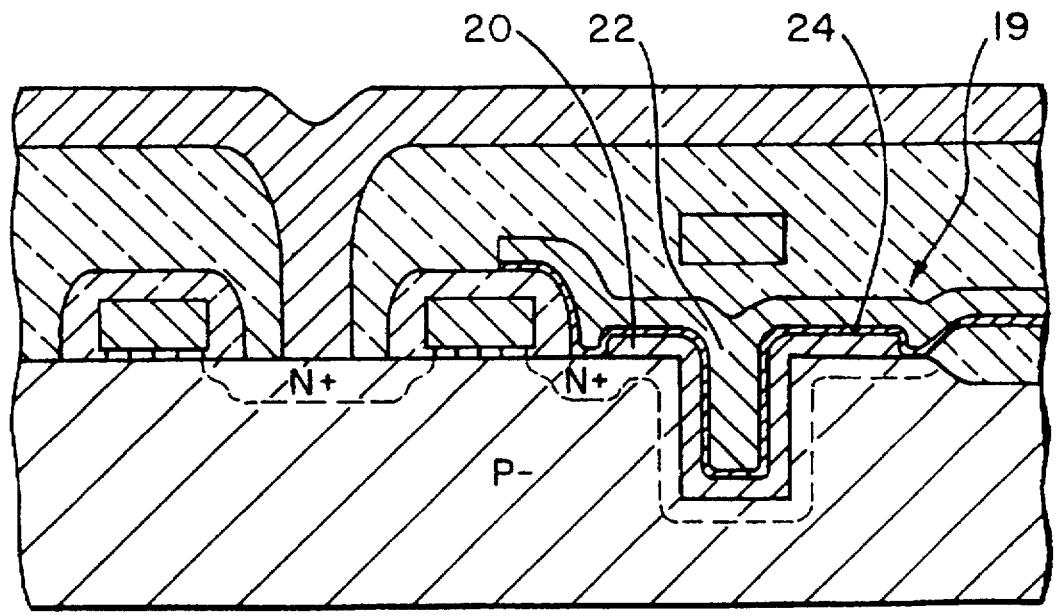
FIG. 2 is a cross-sectional view of a DRAM cell having a typical trench capacitor according to the prior art.
Figure 3:
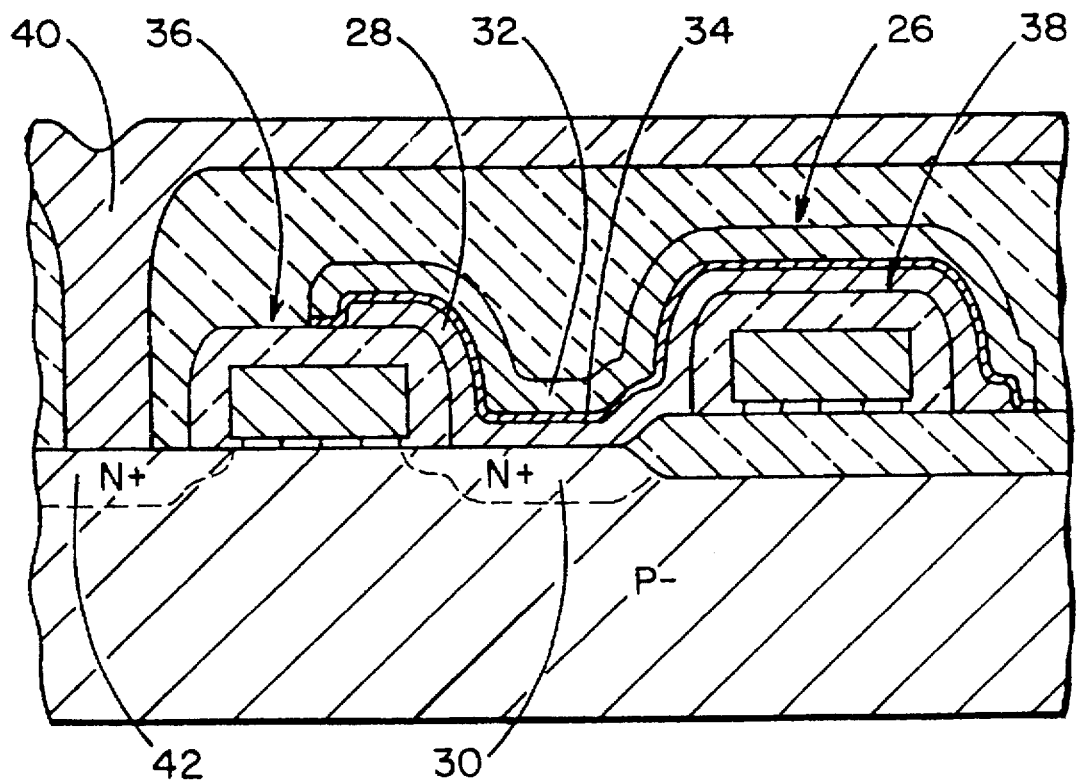
FIG. 3 is a cross-sectional view of a DRAM cell having a typical stacked capacitor according to the prior art.

As mentioned previously, the broad concept of the subject invention is directed to the use of porous silicon as a first plate of a capacitor structure, thereby greatly increasing the surface area available for the capacitor and thereby the capacitance attainable. This concept can be utilized with many types of capacitors, including planar, trench, and stacked capacitors.

Porous silicon is produced utilizing anodic etching. Anodic etching is performed by submerging the silicon wafer or other silicon substrate in a container of electrolytic solution of hydrofluoric acid and subjecting the wafer to an electrolytic current. The electrolytic current is generated between two electrodes, an anode and a cathode. The wafer or other silicon substrate comprises the anode. The container, or a platinum electrode immersed in the electrolytic solution parallel to the wafer or substrate, comprises the cathode. Typically, anodizing creates a porous surface on the material employed as the anode. The resulting microstructure of the porous surface is a series of elongated pores or depressions, formed by the anodic conversion of the silicon in the hydrofluoric acid. Anodization is typically conducted with a current density range of 10 mA/cm$^2$ to 100 mA/cm$^2$ in a hydrofluoric acid solution having a concentration range between 10 and 60 percent by weight. The anodization current and concentration of hydrofluoric acid solution are typically chosen to produce a porous film density of substantially 45 percent. Porous film density is equal to the percent of weight loss (for a given volume of material anodized) experienced during anodization.

Throughout this application reference is made to doped silicon. P− doped silicon is lightly doped p silicon, and p+ doped silicon is heavily doped p silicon. Suitable p-type dopants are known in the art, and include boron. N-type dopants to form n-doped silicon are also known in the art and include, for example, arsenic or phosphorus. For example, the silicon substrate may be a silicon wafer, typically comprising a p+ silicon substrate with a p− epitaxial layer on its surface.

The formation of conformal overlying layers of dielectric material and silicon can be by any suitable means. Chemical vapor deposition is preferred because this process is capable of deposition within the microstructure of the porous silicon. The dielectric can also be formed by partially oxidizing or nitridizing the silicon substrate, partially filling the microstructure pores or depressions. Each and every pore or depression does not need to be filled with the dielectric and silicon layers. A small amount of unfilled pores will slightly decrease the great increase in surface area attained with the porous silicon as the plate of the capacitor.

Preferred thickness of the dielectric material is as follows: oxide, less than 100Å; nitride, less than 100Å; oxide/nitride, less than 40Å of oxide and less than 50Å of nitride; nitride/oxide, less than 50Å of nitride and less than 10Å of oxide; oxide/nitride/oxide, less than 40Å of the first oxide, less than 50Å of the nitride, and less than 10Å of the second oxide.

Figure 4:
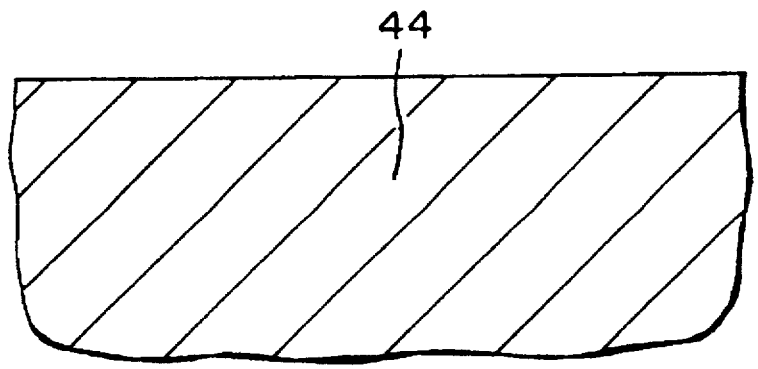
FIG. 4 shows a silicon substrate which will be utilized to form a capacitor according to one embodiment of the subject invention.
Figure 5:
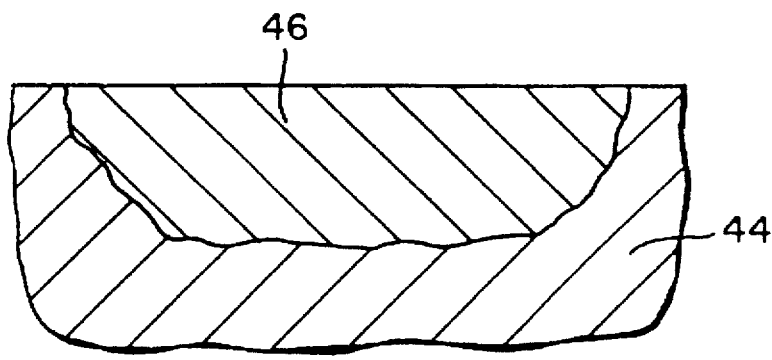
FIG. 5 shows the silicon substrate of FIG. 4 with an area of porous silicon formed therein.
Figure 6:
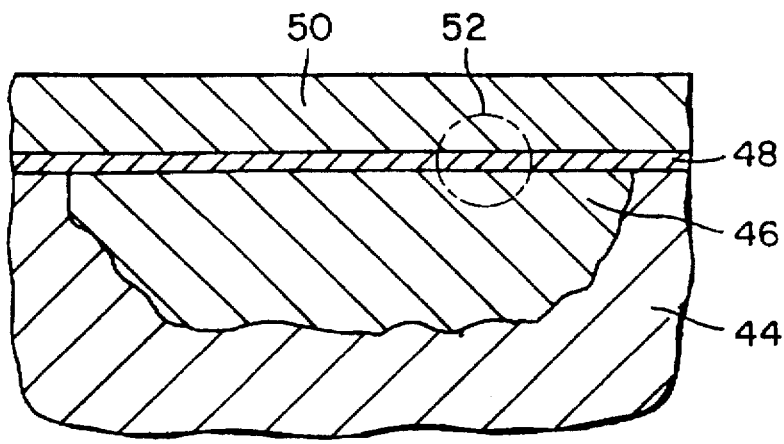
FIG. 6 shows the structure of FIG. 5 with a dielectric layer overlying the porous silicon region and a layer of silicon overlying the dielectric layer.
Figure 7:
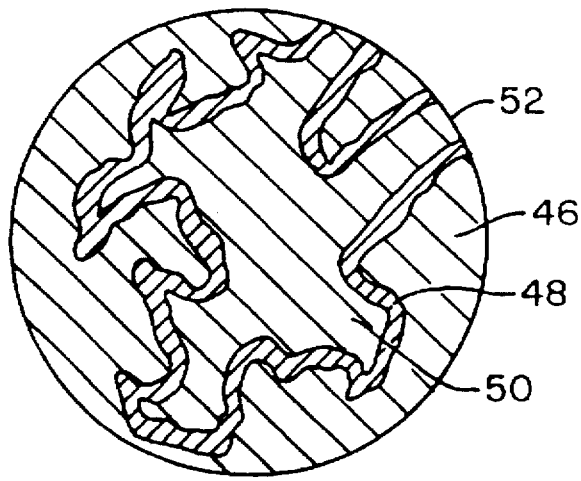
FIG. 7 is an enlargement of an area such as that shown in FIG. 6, showing the porous silicon which forms a first plate of a capacitor, the layer of silicon (such as polysilicon) which forms the second plate of the capacitor, and the layer of dielectric material separating the first plate from the second plate.

Referring to FIG. 4, a silicon substrate 44 is shown. The silicon substrate 44 is anodically etched to form a porous silicon region 46 (see FIG. 5). Although not shown in detail, the porous silicon region as used throughout this application refers to a microstructure such as that as shown in FIG. 7 having a series of random pores or depressions throughout the porous silicon region. To construct the capacitor structure according to the subject invention, a conformal layer of dielectric material 48 is formed overlying the porous silicon region 46, followed by a conformal layer of polysilicon 50 (see FIG. 6). As discussed above, the conformal layer of dielectric material overlying the porous silicon region refers to the dielectric material extending to within the porous microstructure. Likewise, the conformal layer of polysilicon overlying the dielectric material also extends to within the porous microstructure. As shown in the enlargement 52 in FIG. 7, the capacitor structure is thus comprised of the first plate of porous silicon 46, the second plate of polysilicon 50, and the dielectric material 48 separating the two plates.

Figure 8:
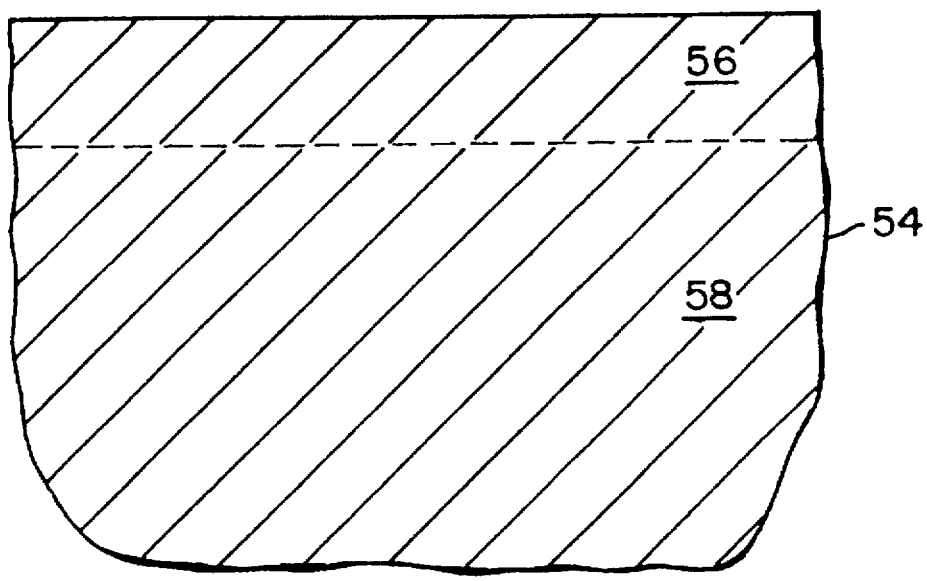
FIG. 8 shows a silicon substrate, having an upper p− portion and a lower p+ portion, which will be utilized to form a capacitor structure according to another embodiment of the subject invention.
Figure 9:
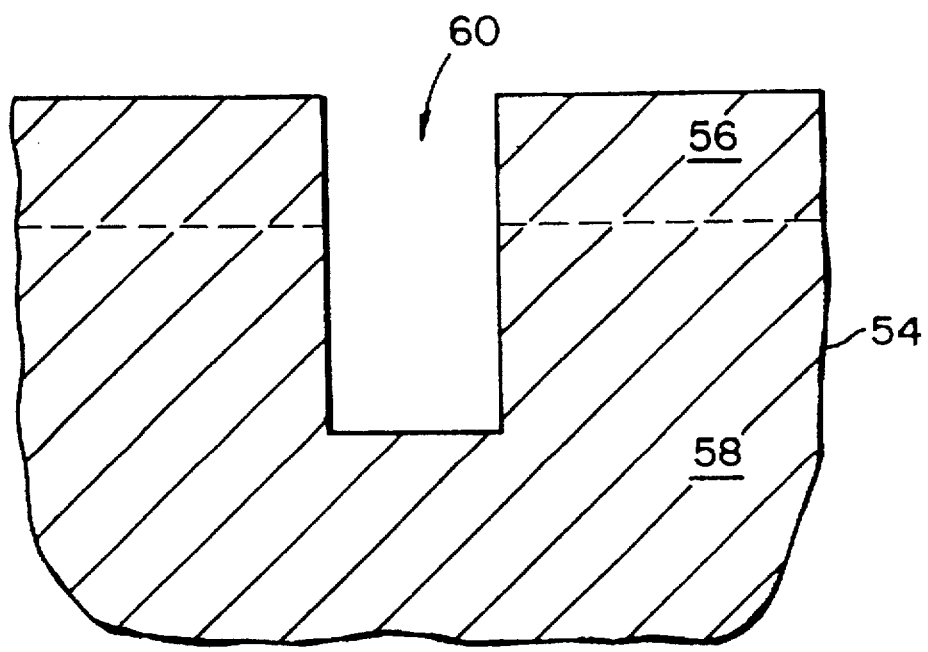
FIG. 9 shows the silicon substrate shown in FIG. 8 with a trench etched therein, extending through the p− layer and into the p+ layer.
Figure 10:
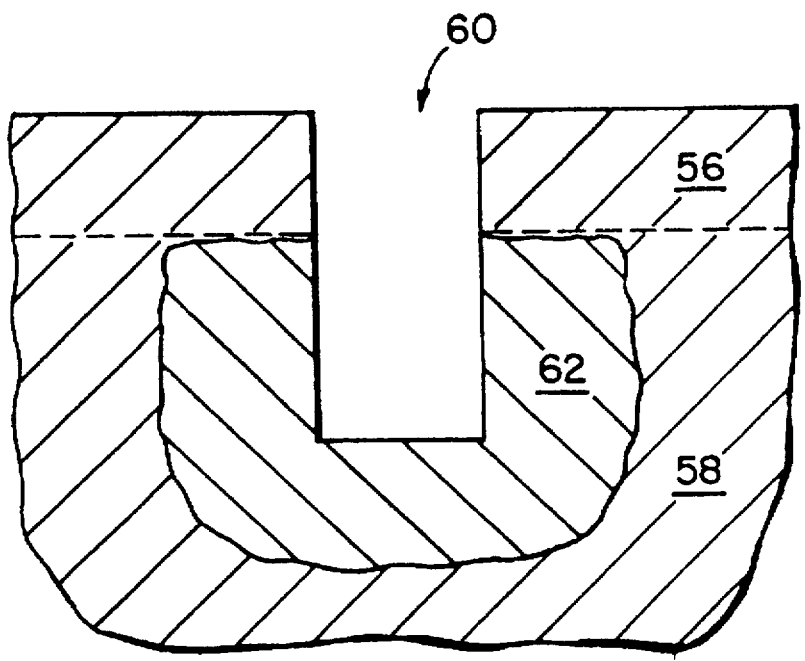
FIG. 10 shows the structure of FIG. 9 with an area of porous silicon etched to surround the side walls and bottom of the trench in the p+ silicon portion of the substrate.
Figure 11:
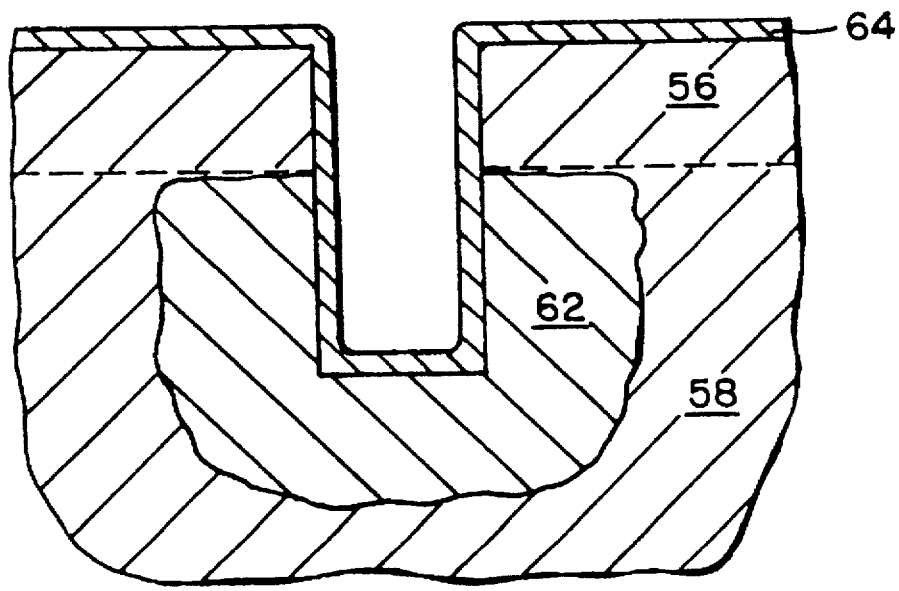
FIG. 11 shows the conformal layer of dielectric deposited on the structure of FIG. 10.
Figure 12:
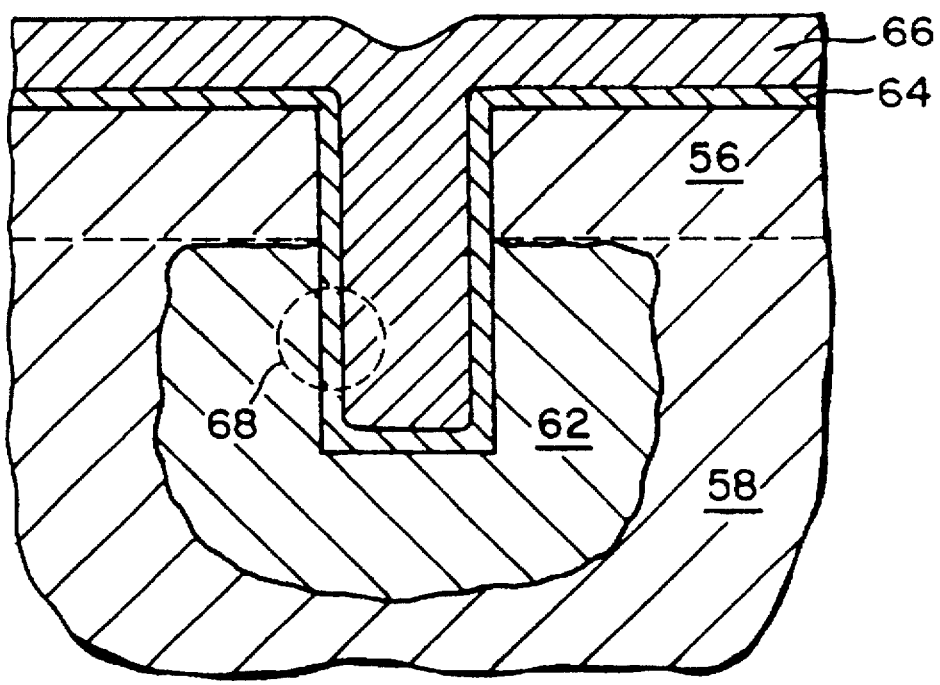
FIG. 12 shows the conformal layer of silicon deposited on the dielectric layer of FIG. 11.
Figure 13:
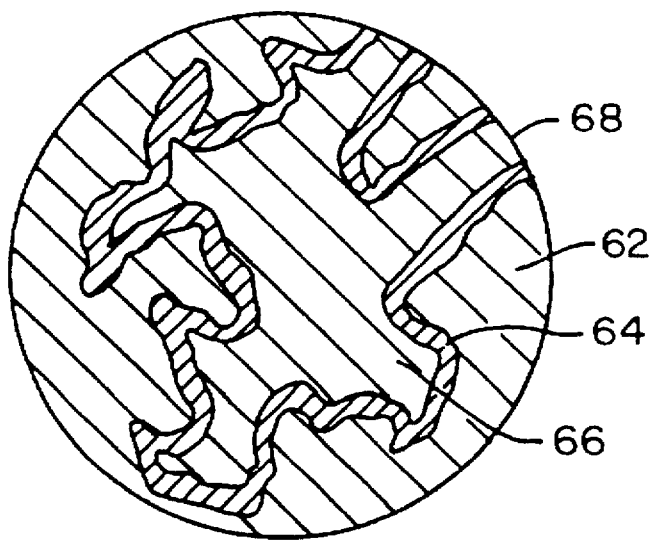
FIG. 13 shows an enlargement of the area shown in FIG. 12, showing the capacitor structure including the porous silicon as the first capacitor plate and the layer of silicon as the second capacitor plate, separated by the dielectric material.

The concept of the invention can be extended to a trench type capacitor as shown in FIGS. 8–13. Referring to FIG. 8, a silicon substrate 54 has an upper portion 56 of p– silicon and a lower portion 58 of p+ silicon. A trench 60 is etched into the silicon substrate 54, through the upper portion 56 and into the lower portion 58 (see FIG. 9). Anodic etching is then utilized to form a porous silicon region 62 surrounding the trench sidewalls and the trench bottom in the lower portion 58 of the silicon substrate. Porous silicon forms much more rapidly in the P+ silicon than in the P– silicon therefore generally resulting in a structure depicted in FIG. 10. This porous silicon region 62 forms the first plate of a capacitor structure, onto which is conformally deposited an overlying layer of dielectric material 64 (see FIG. 11) followed by conformal deposition of an overlying polysilicon layer 66 (see FIG. 12). As shown in the enlargement 68 of FIG. 13, the porous silicon region 62 thus forms the first plate of the capacitor which is separated from the second plate of the capacitor, the polysilicon 66, by the dielectric material 64.

Figure 14:
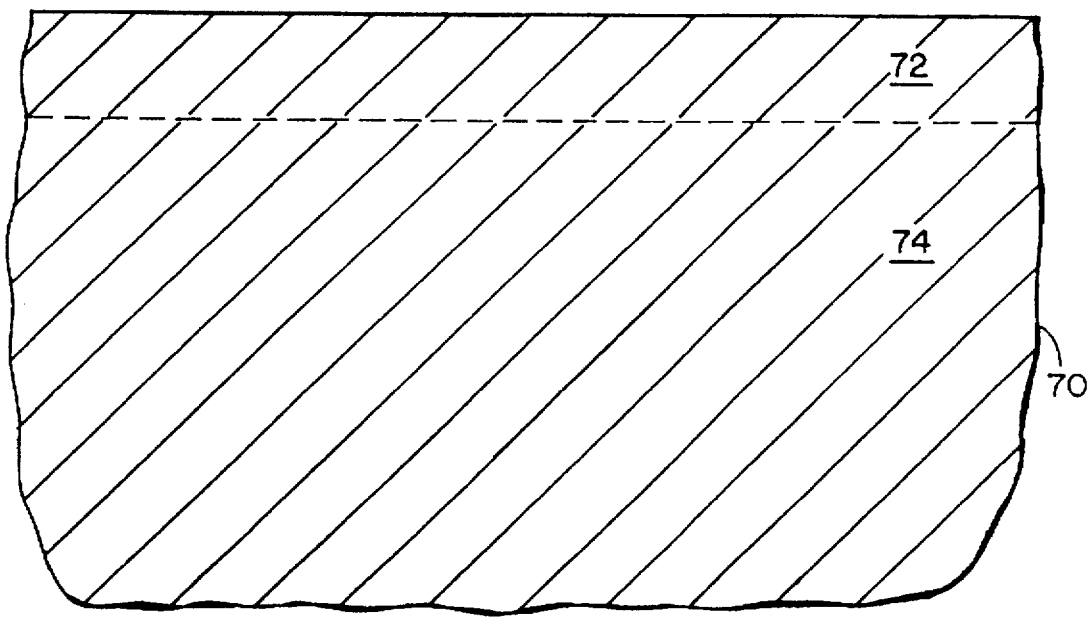
FIG. 14 is a silicon substrate having an upper portion of p− silicon and a lower portion of p+ silicon which will be utilized to form isolated, adjacent trenches according to another embodiment of the subject invention.
Figure 15:
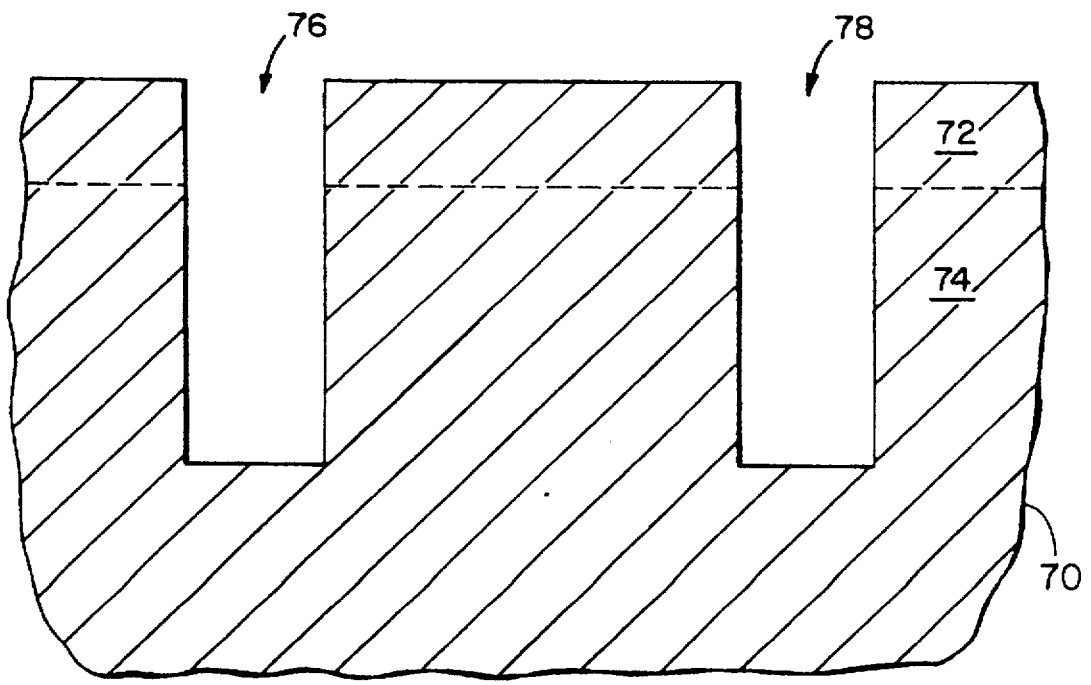
FIG. 15 shows the silicon substrate of FIG. 14 with two adjacent trenches etched therein through the upper portion and into the lower portion.

Through the use of anodic etching, a self-limiting method is provided according to the subject invention to form isolated, adjacent trenches. Referring to FIG. 14, a silicon substrate 70 is again shown as having an upper portion 72 of p– silicon and a lower portion 74 of p+ silicon. Two adjacent trenches 76 and 78 are reactive ion etched into the silicon substrate 70, through the upper portion 72 and into the lower portion 74 (see FIG. 15). Anodic etching is utilized to form a porous silicon region 80 surrounding the lower portion of trench 76, and to form a porous silicon region 82 surrounding the lower portion of trench 78. The anodic etching process is self-limiting, in that the two areas of porous silicon 80 and 82 will not connect. A wisp or layer of non-porous silicon 84 will remain between the two porous silicon regions, keeping trench 76 isolated from trench 78 (see FIG. 16).

Figure 16:
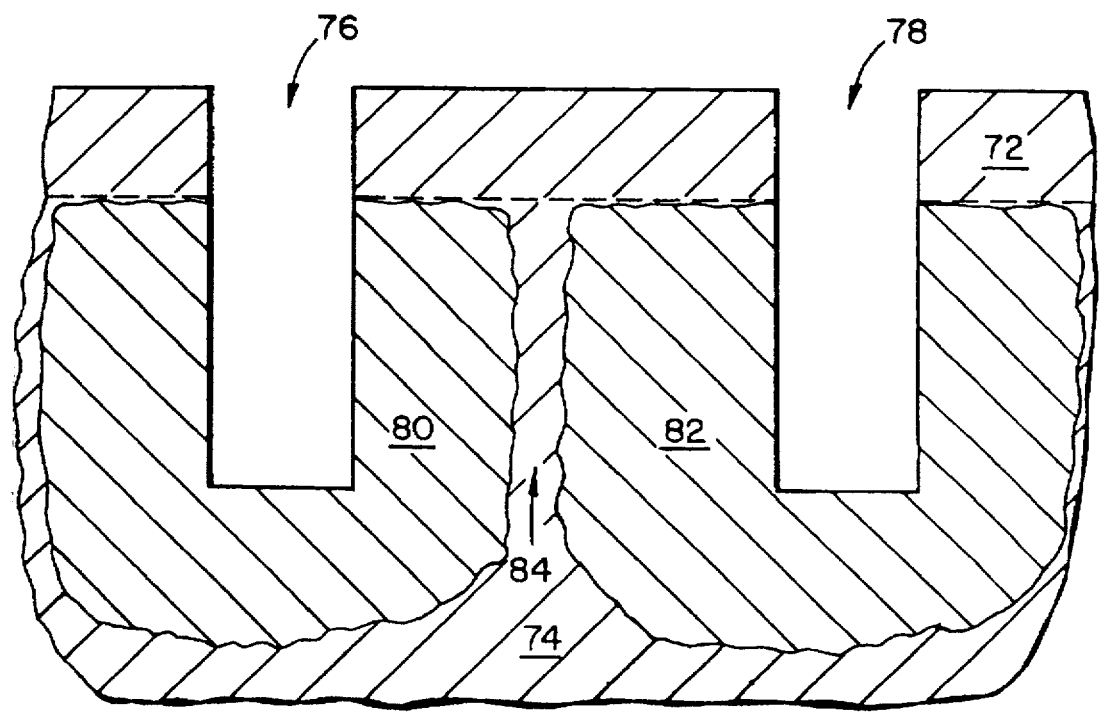
FIG. 16 shows the areas of porous silicon which are anodically etched to surround each of the two adjacent trenches shown in FIG. 15, with the area of non-porous p+ silicon separating the two porous silicon areas.
Figure 17:
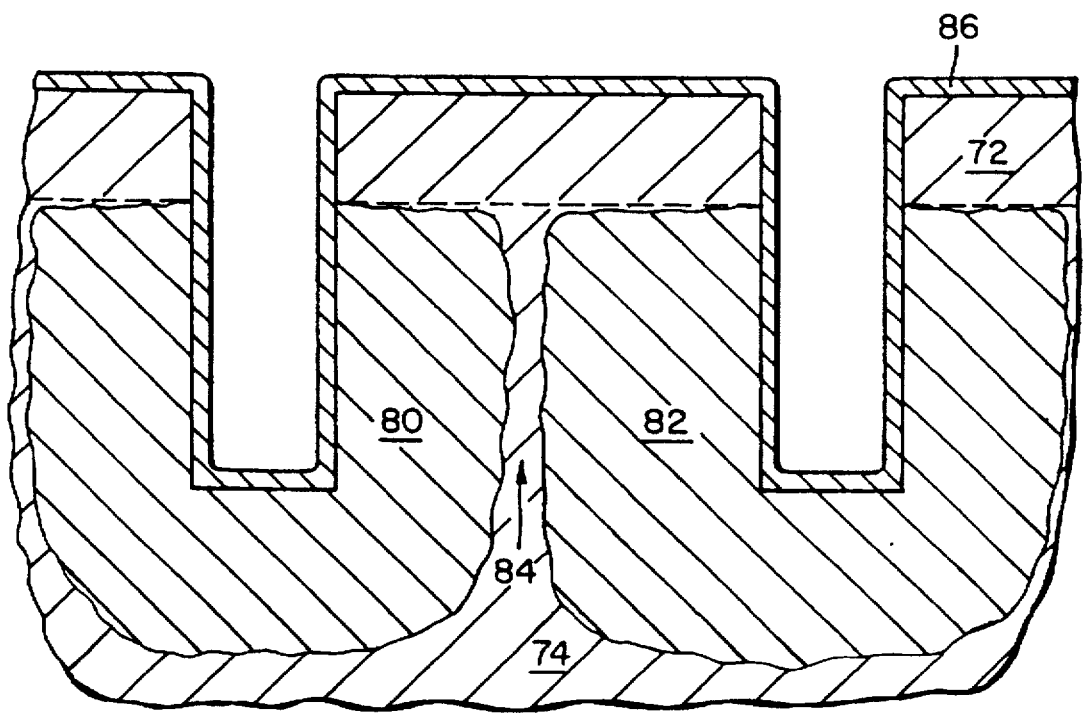
FIG. 17 shows the structure of FIG. 16 with the conformal layer of dielectric material deposited thereon.
Figure 18:
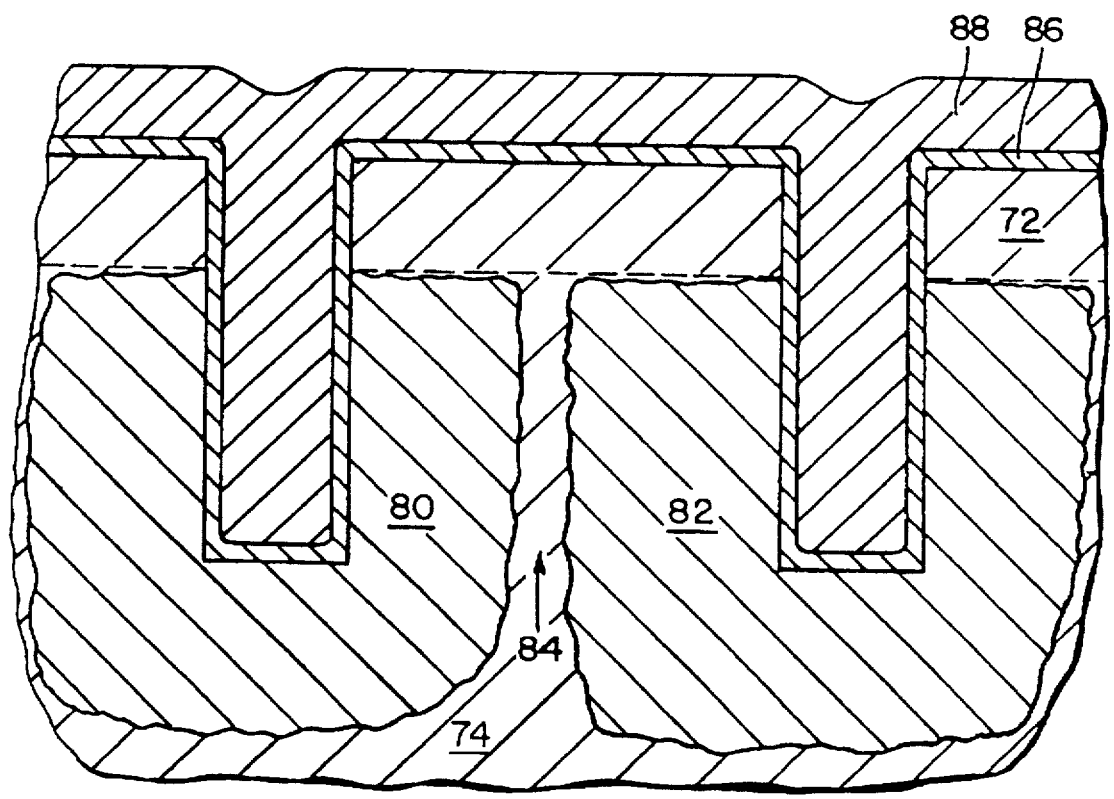
FIG. 18 shows the structure of FIG. 17 with the conformal layer of silicon deposited thereon, resulting in two adjacent trench capacitor structures that are isolated from one another by the area of non-porous silicon.

To form a capacitor structure from the trench structure shown in FIG. 16, a conformal overlying layer of dielectric material 86 is deposited (see FIG. 17), followed by a conformal overlying layer of polysilicon 88 (see FIG. 18). The resulting capacitor structures utilize the porous silicon region 80 or 82 as the first plate of a capacitor structure, with the dielectric material 86 separating the first plate from the second plate of polysilicon 88. In this embodiment, the separate porous silicon regions are self-aligned to their respective cells to utilize a high percentage of cell area for the capacitors.

As indicated above, the concept of the subject invention can be utilized in various types of capacitors, including trench capacitors. One application of the invention is in the context of a semiconductor trench capacitor cell with merged isolation and node trench (MINT) construction. The construction of a MINT capacitor is briefly described below, and more fully described in U.S. Pat. No. 4,801,988, issued Jan. 31, 1989, the contents of which are hereby incorporated by reference into the subject application.

Figure 19:
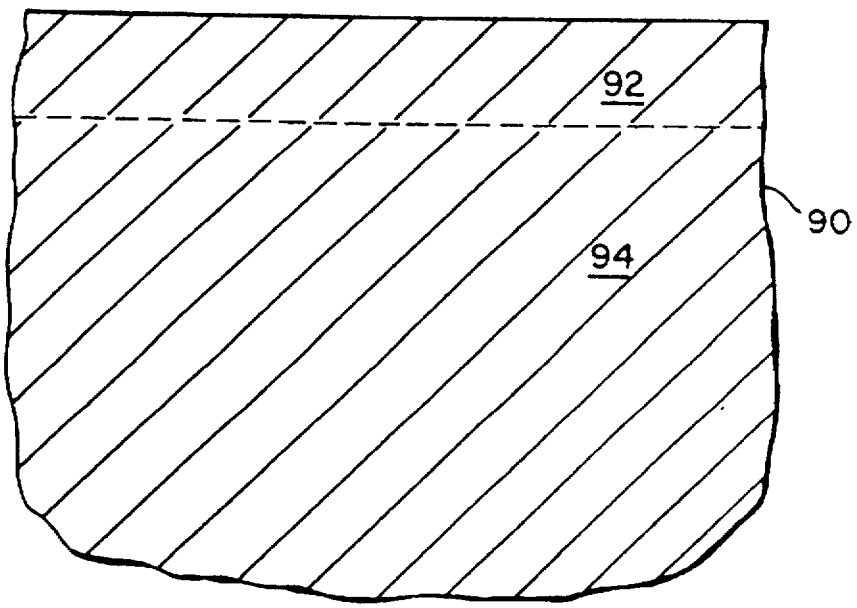
FIG. 19 shows a silicon substrate having an upper p− portion and a lower p+ portion which will be used to form a capacitor structure according to another embodiment of the subject invention.
Figure 20:
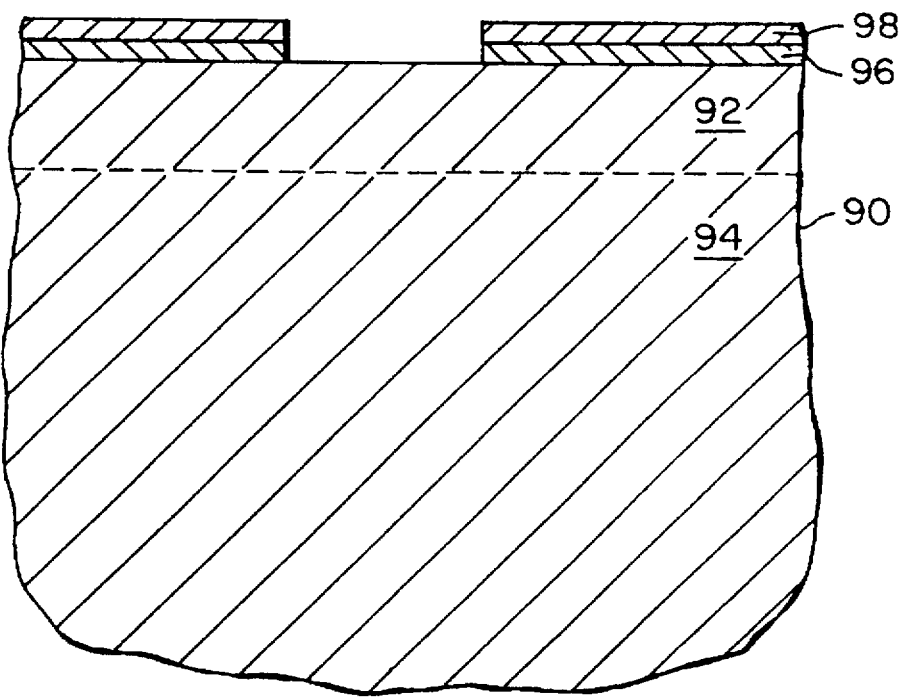
FIG. 20 shows the silicon substrate shown in FIG. 19 with oxide and nitride masking films thereon to define a trench.
Figure 21:
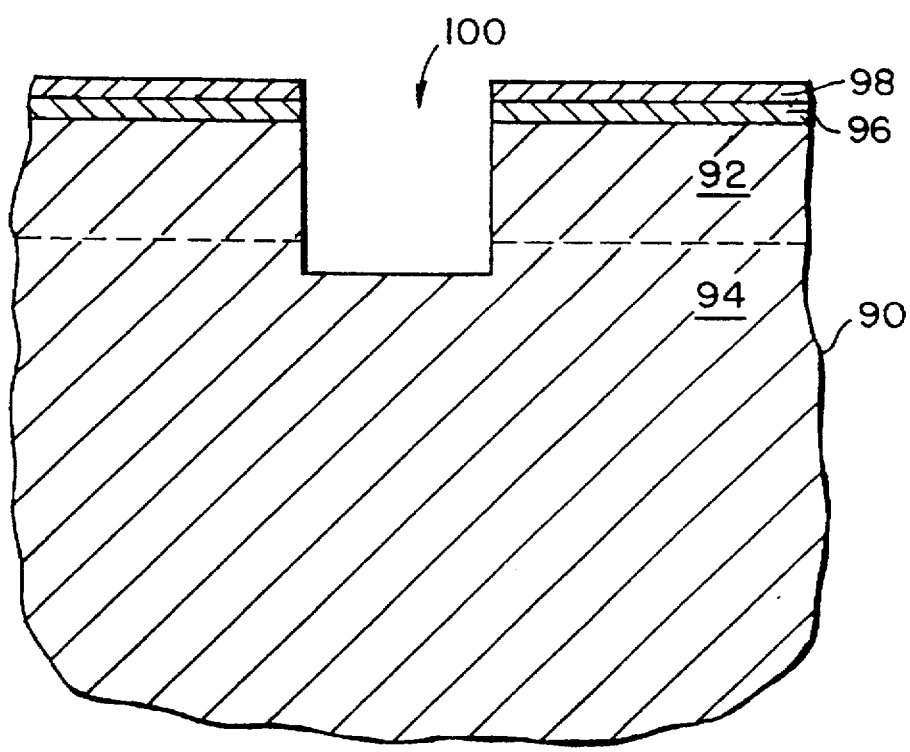
FIG. 21 shows the structure of FIG. 20 with a trench etched therein through the p− portion and into the p+ region.
Figure 22:
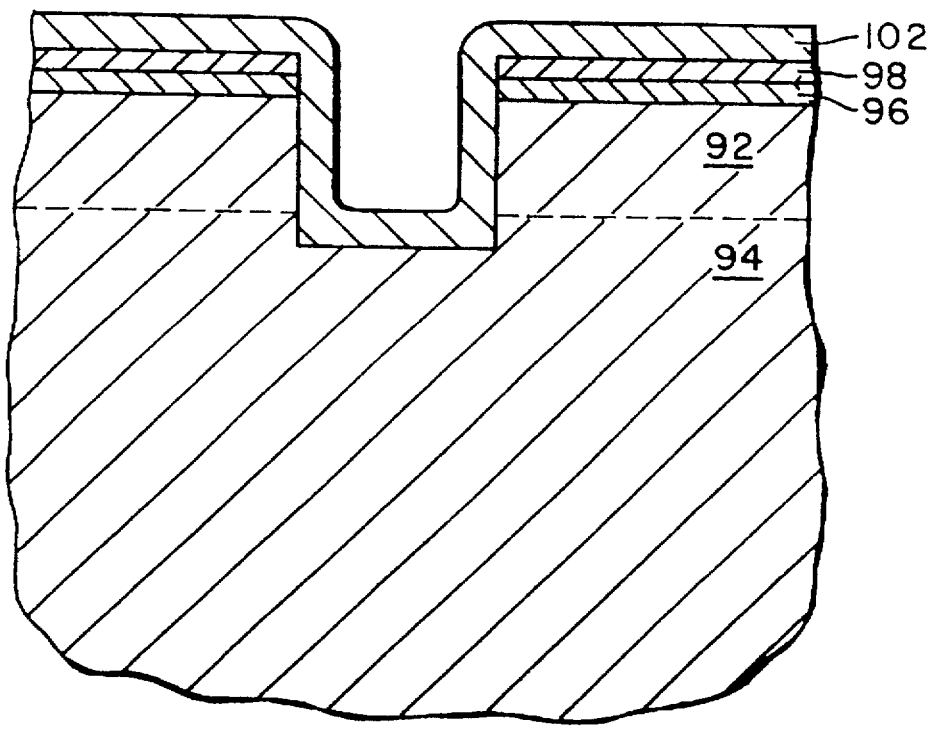
FIG. 22 shows the structure of FIG. 21 with a thick oxide/nitride layer deposited thereon.
Figure 23:
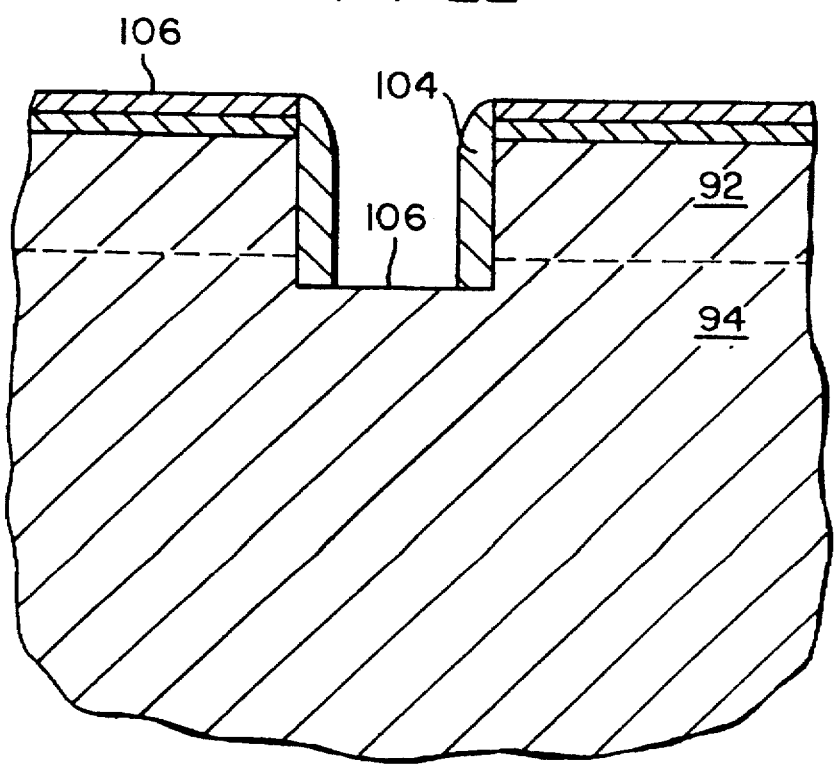
FIG. 23 shows the structure of FIG. 22 after reactive ion etching to form the oxide/nitride spacers on the trench sidewalls.
Figure 24:
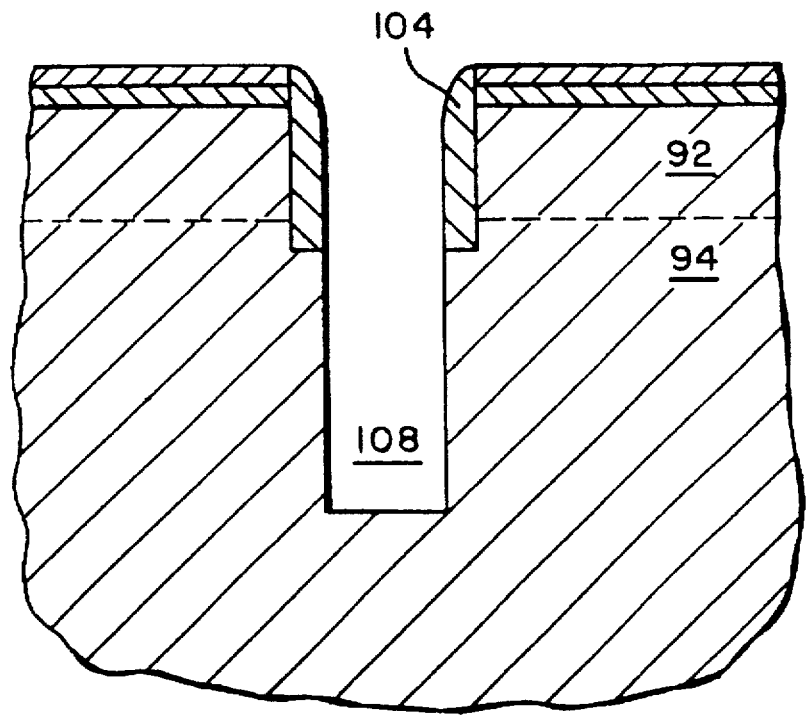
FIG. 24 shows the structure of FIG. 23 after additional reactive ion etching to form a deeper trench structure, extending below the level of the oxide/nitride spacers.

Referring to FIG. 19, a semiconductor substrate of silicon 90 is shown with p– upper portion 92 and p+ lower portion 94. Masking films of oxide 96 and nitride 98 are utilized to define a trench (see FIG. 20), and the trench 100 is then etched into the silicon substrate 90 through the upper portion 92 and into the lower portion 94 (see FIG. 21) to a first trench depth. A layer of dielectric material 102, such as a dual oxide and nitride layer, is then conformally deposited (see FIG. 22). Reactive ion etching (RIE) is then utilized to etch away the dielectric material on all horizontal surfaces, leaving the vertical sidewall spacers 104 shown in FIG. 23 and the exposed horizontal surfaces 106. Further RIE is then utilized to etch a deeper trench 108 into the p+ lower portion 94 of the silicon substrate (see FIG. 24).

Figure 25:
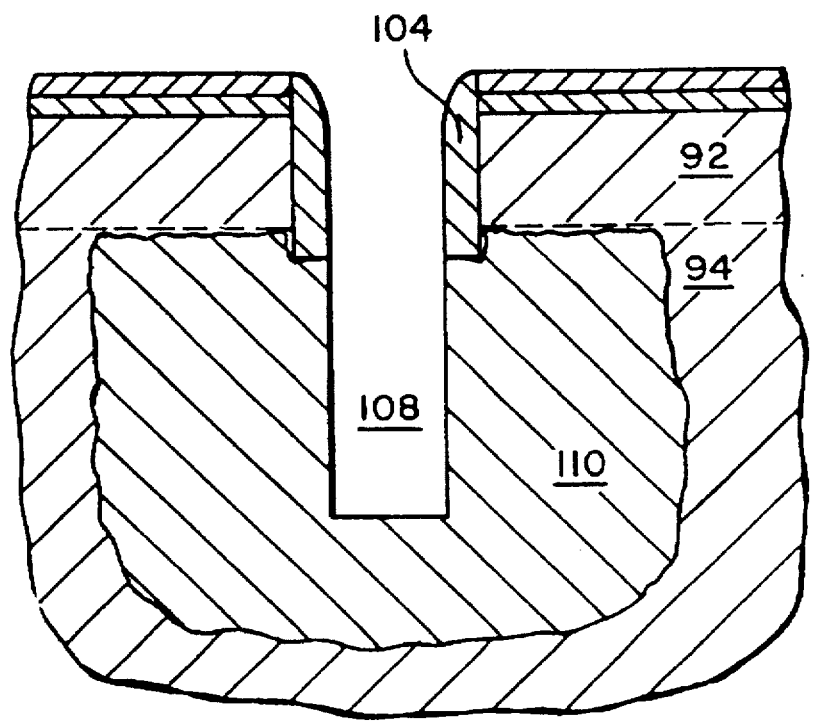
FIG. 25 shows the structure of FIG. 24 after anodic etching to form a porous silicon region in the p+ silicon below the oxide/nitride spacers.

At this point, the concept of the subject invention is utilized to increase the surface area that will be available for the capacitor structure. This is accomplished by utilizing anodic etching to form a porous silicon region 110 surrounding the trench 108 sidewalls and bottom in the p+ portion 94 of the silicon substrate (see FIG. 25). Note that the porous silicon region 110 does not extend appreciably above the level of the sidewall spacers 104 into the p– portion 92.

Figure 26:
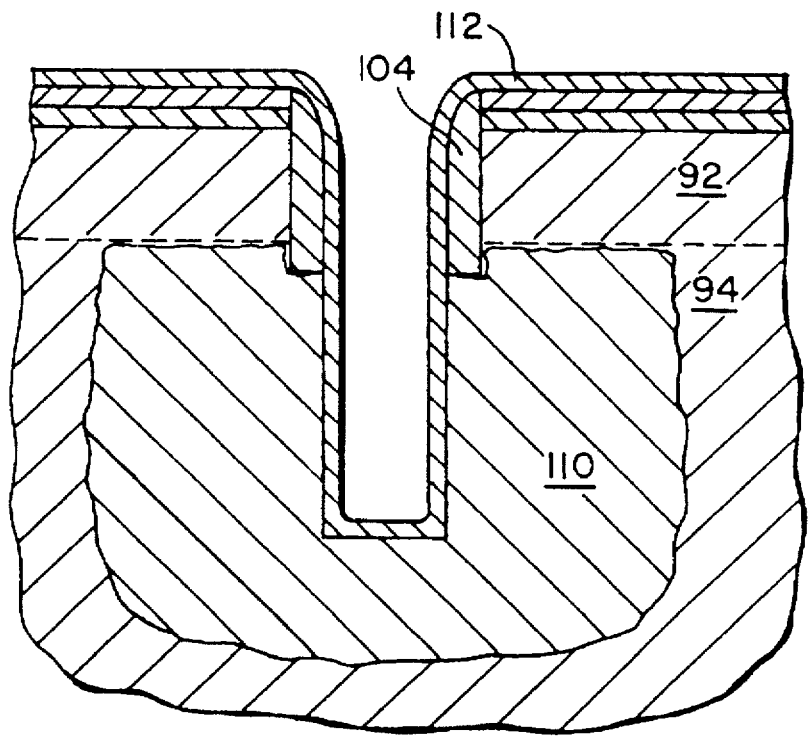
FIG. 26 shows the structure of FIG. 25 after deposition of a conformal dielectric layer.

Having thus increased the surface area that will be available for the capacitor structure, with the porous silicon area forming the first plate of the capacitor, a conformal overlying layer of dielectric 112 is then deposited (see FIG. 26) followed by a conformal overlying layer of polysilicon 114 (see FIG. 27) which forms the second plate of the capacitor. The first plate is separated from the second plate by the dielectric material 112.

Figure 27:
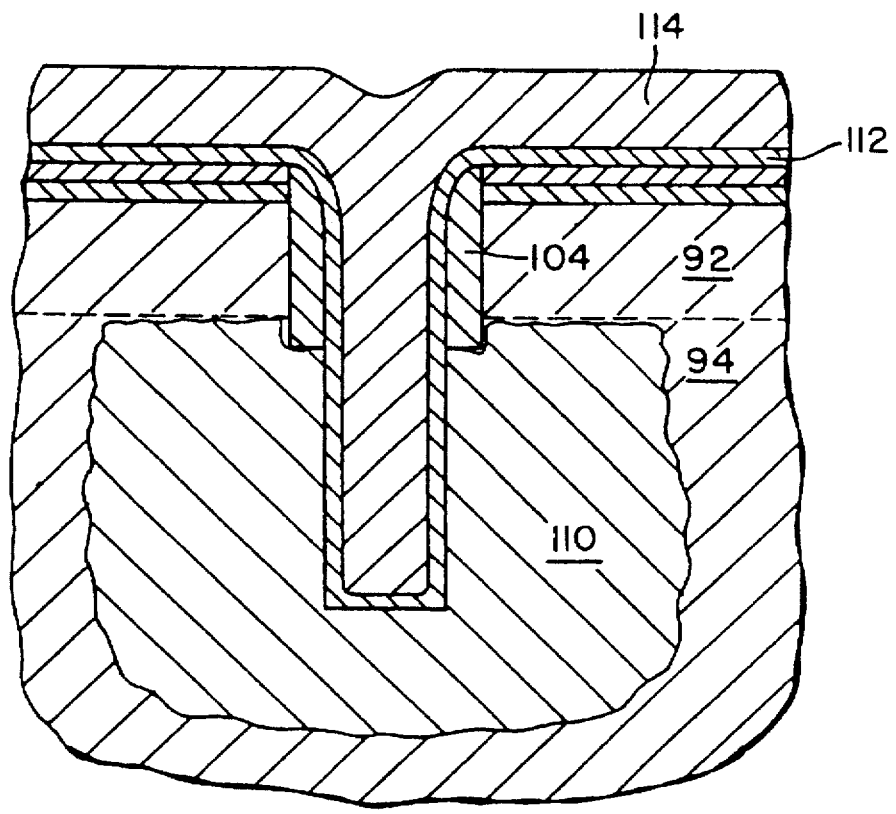
FIG. 27 shows the structure of FIG. 26 after deposition of a conformal layer of silicon.
Figure 28:
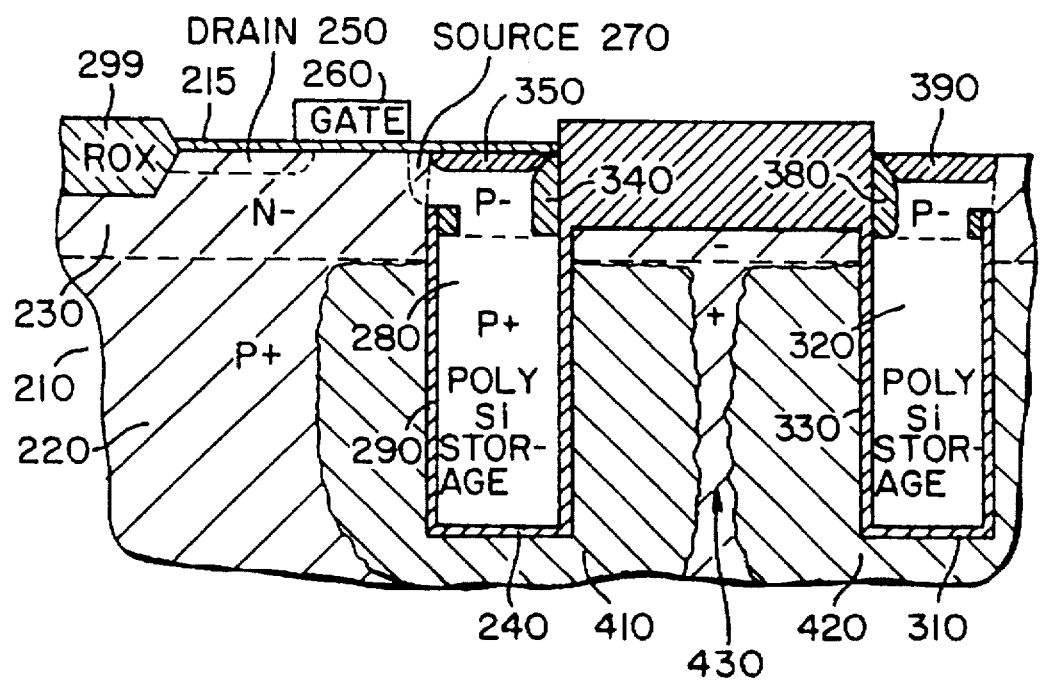
FIG. 28 shows the structure of FIG. 27 in relation to the other components of the semiconductor device into which the structure could be incorporated.

FIG. 28 shows the MINT capacitor structure of FIG. 27 as it may be incorporated into a semiconductor device. In FIG. 28, a dynamic memory cell with a semiconductor trench capacitor cell structure according to one embodiment of the subject invention is shown. The dynamic memory cell is formed in a composite semiconductor substrate 210 in which an N-well 230 is formed in a P+ substrate portion 220. On the surface of the semiconductor substrate 210, a transistor is constructed of a P+ drain diffusion 250, a gate electrode 260, and a P+ source diffusion 270. The insulation between the gate electrode 260 and the substrate as well as the thin insulating layer on top of the source diffusion 270 and drain diffusion 250 is shown schematically as a single thin insulation layer 215. To the left of the drain 250, there is shown a partial section of a recessed oxide layer 299 which can be used to support and insulate additional memory array circuitry (e.g. wordlines and bitlines, not shown). Adjacent to the source diffusion 270 is a semiconductor trench capacitor cell 240 of one embodiment of the subject invention. The semiconductor trench capacitor cell 240 is insulated from the semiconductor substrate 210 by a thin insulation layer 290, and is isolated from adjacent semiconductor trench capacitor cells by side-wall defined, thick isolation layers 340 and 350. Also shown for illustration is another semiconductor trench capacitor cell 310. The semiconductor trench capacitor cell 310 is also insulated from the semiconductor substrate 210 by a thin insulation layer 330, and is isolated from adjacent devices by thick isolation layers 380 and 390. Both semiconductor trench capacitor cells are filled with a P+ doped conductive polysilicon 280 and 320 respectively. In accordance with the subject invention, each trench capacitor cell 240 and 310 is surrounded by an area of porous silicon, 410 and 420 respectively, separated by a wisp or area of non-porous silicon 430.

Figure 29:
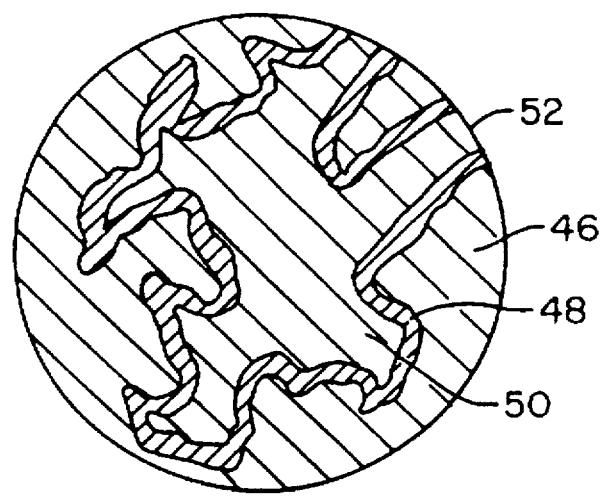
FIG. 29 shows an enlargement of the microstructure of a capacitor formed according to the subject invention, particularly the surface area of the porous silicon as it exists throughout the porous silicon region, including the porous silicon surface as the first plate of the capacitor, the polysilicon as the second plate of the capacitor, and the dielectric material separating the two plates.

The great increase in surface area according to the structures and methods of the subject invention is best illustrated in the enlargement 52 shown in FIG. 29. For each of the porous silicon/dielectric/polysilicon structures discussed above, the structure on a microscopic level is actually a series of random pores or depressions in the silicon forming the porous silicon 46. The conformal overlying layer of the dielectric material 48 extends to within each of the pores or depressions within the porous silicon 46 as shown. The conformal overlying layer of the polysilicon 50 likewise extends to within each of the pores or depressions, resulting in a capacitor structure such as is shown in FIG. 29 which utilizes the entire surface area of the porous silicon for the capacitor plate. Thus, it is readily apparent that the surface area of the capacitor, and thus the capacitance, is greatly increased according to the subject invention.

While the invention has been particularly shown and described with reference to preferred embodiments thereof, it will be understood by those skilled in the art that various changes in form and details may be made therein without departing from the spirit and scope of the invention.

We claim:

1. A method of forming a semiconductor capacitor structure, said method comprising:
   forming a substrate of monocrystalline silicon, said substrate having an upper portion and a lower portion, said upper portion having a low conductivity and said lower portion having a high conductivity;
   anodically etching said substrate of silicon so as to form porous silicon within said lower portion of said substrate:
   forming a conformal layer of a dielectric material overlying said porous silicon; and
   forming a conformal layer of silicon overlying said layer of dielectric material;
   wherein said porous silicon forms a first plate of a capacitor structure and said conformal layer of silicon forms a second plate of said capacitor structure, said first plate separated from said second plate by said dielectric material.

2. The method of claim 1 wherein said conformal layer of dielectric material comprises multi-layer dielectric material.

3. The method of claim 1 wherein said lower portion of said substrate comprised of monocrystalline silicon comprises p+ monocrystalline silicon.

4. The method of claim 2 wherein said multi-layer dielectric material is selected from the group consisting of oxide/nitride, nitride/oxide, and oxide/nitride/oxide.

5. The method of claim 1 wherein said conformal layer of silicon comprises polysilicon.

6. The method of claim 1 wherein said forming of a conformal layer of a dielectric material comprises deposition or thermal growth of said conformal layer of dielectric material.

7. The method of claim 6 wherein said deposition comprises chemical vapor deposition.

8. The method of claim 1 wherein said forming of a conformal layer of silicon comprises deposition of said conformal layer of silicon.

9. The method of claim 8 wherein said deposition comprises chemical vapor deposition.

10. A method of forming a trench capacitor structure, said method comprising:
    forming a trench in a monocrystalline silicon substrate, said substrate comprising an upper portion and a lower portion, said upper portion having a low conductivity and said lower portion having a high conductivity;
    anodically etching said silicon substrate surrounding said trench so as to form porous silicon within said lower portion of said substrate;
    forming a conformal layer of a dielectric material overlying said porous silicon; and
    forming a conformal layer of silicon overlying said layer of dielectric material;
    wherein said porous silicon forms a first plate of a capacitor structure and said conformal layer of silicon forms a second plate of said capacitor structure, said first plate separated from said second plate by said layer of dielectric material.

11. The method of claim 10 wherein said lower portion of said monocrystalline silicon substrate comprises p+ monocrystalline silicon.

12. The method of claim 10 wherein said dielectric material comprises a multi-layer dielectric material.

13. The method of claim 10 wherein said dielectric material is selected from the group consisting of nitride, oxide, oxide/nitride, nitride/oxide, and oxide/nitride/oxide.

14. The method of claim 10 wherein said conformal layer of silicon comprises polysilicon.

15. The method of claim 10 wherein said forming of a conformal layer of a dielectric material comprises deposition of said conformal layer of dielectric material.

16. The method of claim 15 wherein said deposition comprises chemical vapor deposition.

17. The method of claim 10 wherein said forming of a conformal layer of silicon comprises deposition of said conformal layer of silicon.

18. The method of claim 17 wherein said deposition comprises chemical vapor deposition.

19. A self-limiting method of forming isolated adjacent trenches in a substrate, said method comprising:
    forming a pair of adjacent trenches in a monocrystalline silicon substrate;
    anodically etching said silicon substrate surrounding each of said adjacent trenches so as to form a pair of porous silicon regions;
    wherein said anodic etching is performed contemporaneously within each of said pair of trenches by a self-limiting process and leaves an area of non-porous silicon between said pair of porous silicon regions, thereby isolating said pair of adjacent trenches.

20. The self-limiting method of claim 19 wherein said forming of a pair of adjacent trenches comprises etching of said pair of adjacent trenches in said silicon substrate.

21. The self-limiting method of claim 20 wherein said etching comprises reactive ion etching.

22. The self-limiting method of claim 19 wherein said silicon substrate comprises p+ silicon.

23. The self-limiting method of claim 19 further comprising:
    forming a conformal layer of a dielectric material overlying said porous silicon regions surrounding each of said adjacent trenches; and
    forming a conformal layer of silicon overlying each of said conformal layers of dielectric material;
    wherein for each of said adjacent trenches, said porous silicon region forms a first plate of a capacitor structure and said conformal layer of silicon forms a second plate of a capacitor structure, said first plate separated from said second plate by said conformal layer of dielectric material.

24. The self-limiting method of claim 23 wherein said dielectric material comprises a multi-layer dielectric material.

25. The self-limiting method of claim 23 wherein said dielectric material is selected from the group consisting of nitride, oxide, oxide/nitride, nitride/oxide, and oxide/nitride/oxide.

26. The self-limiting method of claim 23 wherein said conformal layer of silicon comprises polysilicon.

27. The self-limiting method of claim 23 wherein said forming of said conformal layer of dielectric material comprises deposition of said conformal layer of dielectric material.

28. The self-limiting method of claim 27 wherein said deposition comprises chemical vapor deposition.

29. The self-limiting method of claim 29 wherein said forming of said conformal layer of silicon comprises deposition of said conformal layer of silicon.

30. The self-limiting method of claim 29 wherein said deposition comprises chemical vapor deposition.

31. The method of claim 1 wherein said upper portion of said semiconductor substrate of monocrystalline silicon comprises n-doped monocrystalline silicon.

32. The method of claim 1 wherein said upper portion of said semiconductor substrate of monocrystalline silicon comprises p– monocrystalline silicon.

33. The method of claim 1 wherein anodically etching said substrate of silicon comprises confining said porous silicon essentially to said lowest portion of said substrate.

34. The method of claim 10 wherein anodically etching said silicon substrate comprises confining said porous silicon essentially to said lower portion of said substrate.

* * * * *

UNITED STATES PATENT AND TRADEMARK OFFICE
CERTIFICATE OF CORRECTION

PATENT NO. : 5,635,419
DATED : June 3, 1997
INVENTOR(S) : Geiss et al.

It is certified that error appears in the above-indentified patent and that said Letters Patent is hereby corrected as shown below:

In the Claims:
Claim 1, lines 36-37, "substrate:" should be --substrate;--
Claim 10, line 6, "conductivity:" should be --conductivity;--
Claim 29, line 1, "29" should be --23--.

Signed and Sealed this

Thirtieth Day of September, 1997

Attest:

BRUCE LEHMAN

Attesting Officer

Commissioner of Patents and Trademarks